United States Patent Office 3,825,454
Patented July 23, 1974

3,825,454
METHOD OF FORMING INTERCONNECTIONS
Akira Kikuchi, Takashi Agatsuma, and Akio Anzai, Tokyo, Japan, assignors to Hitachi, Ltd., Tokyo, Japan
Filed Feb. 20, 1973, Ser. No. 333,983
Claims priority, application Japan, Feb. 18, 1972, 47/16,432
Int. Cl. C23f 1/02
U.S. Cl. 156—8 12 Claims

ABSTRACT OF THE DISCLOSURE

A method of forming interconnections, wherein unnecessary parts of a metal layer and a metal oxide film overlying the metal layer are etched using a mixed liquid etchant which consists of phosphoric acid, acetic acid, water, ammonium fluoride and nitric acid having a volumetric ratio of 76:15:5:2 to 6:3, whereby an interconnection portion with gently sloping corners is formed.

BACKGROUND OF THE INVENTION

(1) Field of the Invention

The present invention relates to a method of forming a multi-layer interconnection substrate, and more particularly to an etching treatment process in the formation of interconnection portions of lower layers.

(2) Description of the Prior Art

In the field of IC's, LSI's, etc., as the degree of integration of devices has increased, the necessity for forming multi-layer interconnections on a semiconductor substrate has arisen. The formation of the multi-layer interconnection substrate generally adopted comprises selectively etching a layer of metal, such as aluminum, formed on the upper surface of a base and thus forming the first layer of an interconnection portion, and forming the second layer of an interconnection portion by a similar process through an insulating film formed on the upper surface of the first interconnection layer. In this case, the first layer of the interconnection portion has sharp corners formed at its "shoulder" parts by the etching at the formation thereof. For this reason, the insulating film on the upper surface of the first layer of interconnection portion does not have a uniform thickness, and is formed to be extremely thin in the vicinity of the corners of the first interconnecion portion. The second layer of the interconnection portion on the upper surface of the insulating film and the first layer of the interconnection portion are, accordingly, adjacent each other through the very thin part of the insulating film in the neighborhood of the corner of the first layer of interconnection portion. Therefore, when pinholes or cracks appear in the insulating film at the adjacent part, short-circuiting of the interconnections may occur.

Further, at a position at which the second layer of the interconnection portion intersects with the first layer of the interconnecion portion, the insulating film protrudes abruptly towards the second interconnection layer. At the formation of the second interconnection layer, therefore, it becomes thin at the intersecting part due to the shadowing effect of the insulating film. This leads to such disadvantages that disconnecions, etc. are prone to occur and that reliable multi-layer interconnections are not attainable.

Moreover, the etching rate is comparatively large in the etching processes. A problem, therefore, arises in that the control of the amount of etching is difficult, which results in the possibility of over-etching.

SUMMARY OF THE INVENTION

The present invention has been made in order to eliminate the aforesaid disadvantages.

A principal object of the invention is to provide a method of forming interconnections which is constructed such that short-circuiting between a lower layer of an interconnection portion and an upper layer of an interconnection portion and a disconnection in the upper layer of an interconnection portion in the formation of the interconnections, especially in the formation of a multi-layer interconnection substrate, can be prevented so as to make the multi-layer interconnections reliable.

Another object of the invention is to make the etching amount easily controllable.

The fundamental construction of the present invention for accomplishing the above-mentioned objects consists in a method of forming interconnections wherein a layer of metal is formed on a base, the metal is oxidized, to thereby produce a porous metal oxide in only the surface of the metal layer and, using as a mask an etch-resistant film formed on selected areas of the upper surface of the metal oxide, unnecessary parts of the metal and the metal oxide are etched, the method being characterized by employing as an etching liquid for the metal and the metal oxide an etchant which consists of a mixed solution of phosphoric acid, acetic acid, water, ammonium fluoride and nitric acid, the volumetric ratio of which is 76:15:5:2–6:3.

With the prescribed composition of the liquid etchant as selected according to the present invention, the etching rate becomes slow as a whole, and therewith, the etching rate for the metal film becomes ½–⅓ of the etching rate for the porous metal oxide film, so that the metal layer is etched and removed with a gradually sloping surface defining an angle of approximately 30° to the bottom of the interconnection portion. Accordingly, such as interconnection layer and an upper layer of interconnection portion to be formed thereon through an insulating film are prevented from being short-circuited. In addition, at the position at which the second or higher-order layer of the interconnection portion intersects with an interconnection portion of a layer beneath it, it is difficult for a disconnection of the former layer to occur.

PREFERRED EMBODIMENT OF THE INVENTION

The present invention will now be described in connection with an embodiment thereof and in the sequence of various steps for forming interconnections, reference being had to the accompanying drawings.

Figure 1A:
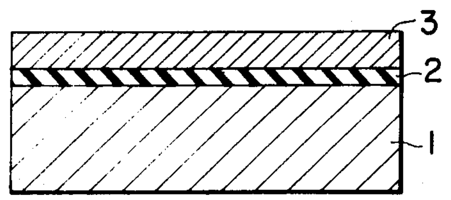
FIGS. 1*a* to 1*e* are longitudinal sections showing an embodiment of the present invention in the sequence of manufacturing steps.

First, as shown in FIG. 1*a*, a metal layer 3, for example, an aluminum layer, to form the first interconnection portion is formed on a surface protecting film 2 of a base 1 by vacuum evaporation. The thickness of the aluminum layer 3 is approximately 1$\mu$.

Figure 1B:
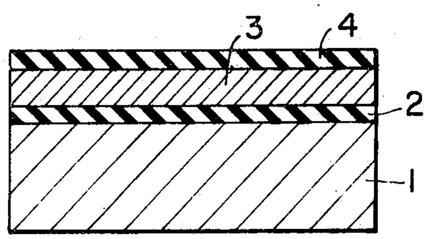

Subsequently, as illustrated in FIG. 1*b*, the upper region of the aluminum layer 3 is oxidized by an anodic oxidation process or a metal oxidizing technique in which the metal is heated in an oxygen atmosphere. Thus, a porous alumina ($Al_2O_3$) film 4 is formed. The thickness of the alumina film 4 is approximately 500 A.–1,000 A. One method for oxidizing the aluminum (Al) 3 into the porous alumina ($Al_2O_3$) 4, as stated above, is the anodic oxidation process in which a 5% oxalic acid solution is used as the treating liquid. The formation of the porous alumina film with the anodic oxidation process can be performed comparatively easily, and the control of the thickness of the film is easy.

Figure 1C:
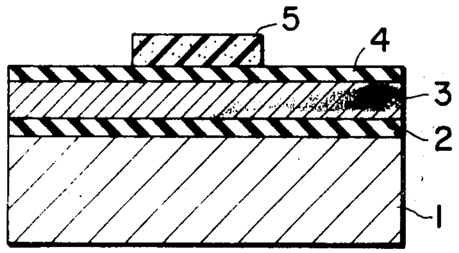

At the next step, as shown in FIG 1*c*, a photoresist film 5 is formed on selected areas of the upper surface of the porous alumina film 4.

Figure 1D:
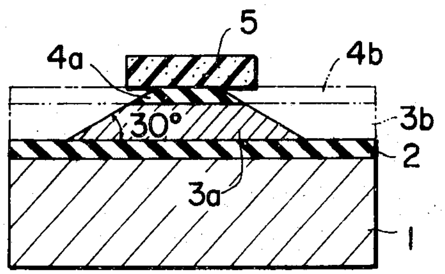
Figure 3:
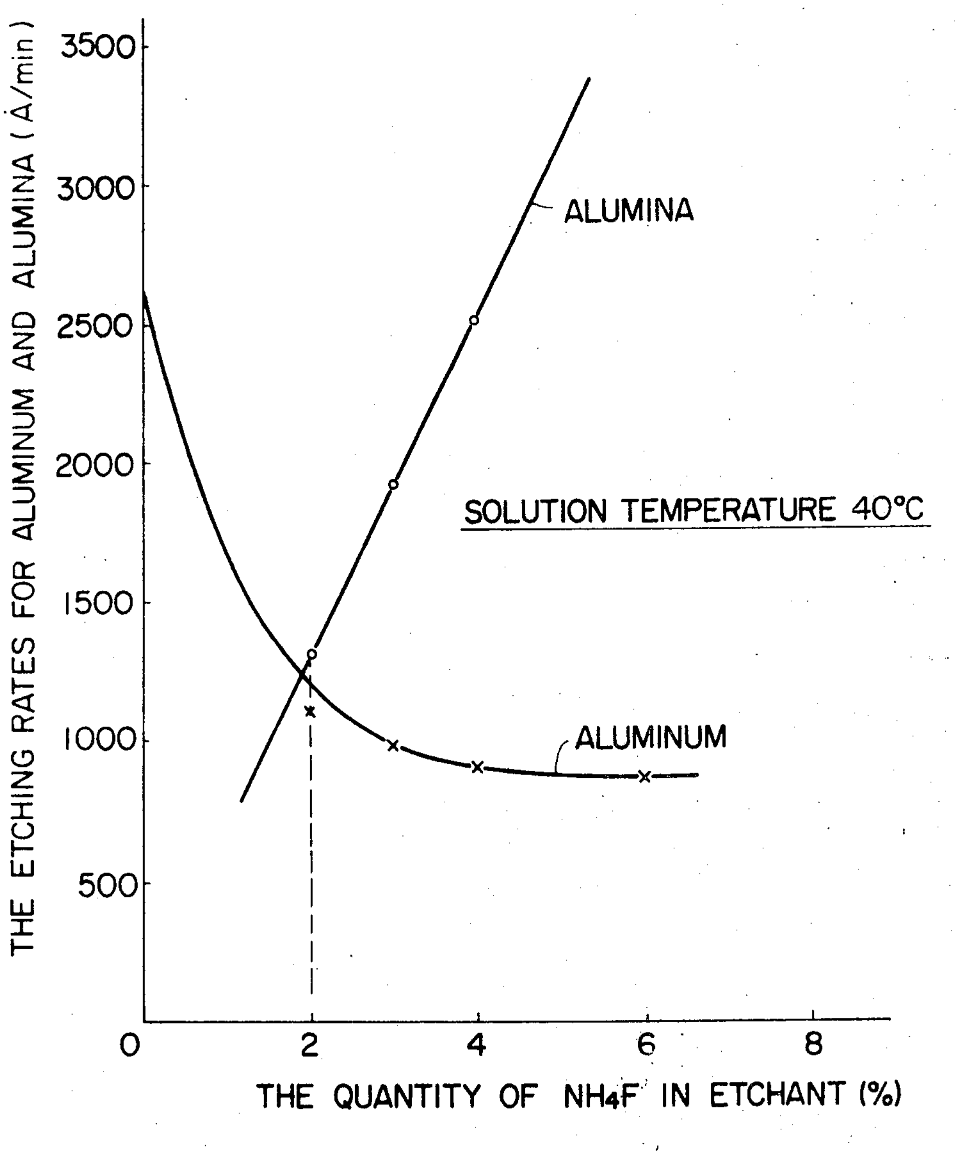
FIG. 3 is a graph showing etching characteristics according to the present invention.

Then, as illustrated in FIG. 1*d*, and etching treatment is conducted using as a mask the photoresist film 5 and as a liquid etchant a mixed solution in which phosphoric acid ($H_3PO_4$), acetic acid ($CH_3COOH$), water ($H_2O$), ammonium fluoride ($NH_4F$) and nitric acid ($HNO_3$) are mixed in the proportions of 760 cc., 150 cc., 50 cc., 40 cc. and 30 cc., respectively. The etching rates of the liquid etchant for the aluminum 3 and for the porous alumina 4 are respectively 1,000 A./min. and 2,500 A./min., and the etching rate for the aluminum becomes ½ to ⅓ of the rate in the prior art. As plotted in FIG. 3, the etching rates for aluminum and alumina differ in dependence on the proportion of the amount of ammonium fluoride ($NH_4F$). While, theoretically the temperature of the etchant may be from room temperature to the boiling point of the etchant, the preferable range is from 20° C. to 60° C. As the quantity of ammonium fluoride increases, the etching rate for aluminum decreases, whereas that for alumina increases. The ratio between the etching rates for aluminum and alumina can be kept within a range of from ½ to ⅓ by controlling the quantity of ammonium fluoride within a range of from 2 to 6 in terms of the volumetric proportion as will be referred to below. As a result of experiments, it has been revealed that, when phosphoric acid, acetic acid, water, ammonium fluoride and nitric acid are mixed at the volumetric ratio of 76:15:5:2–6:3, the etching rate of the etching liquid for aluminum becomes ½–⅓ of that for porous alumina. Accordingly, the entire etching rate becomes comparatively small, making it possible to increase the etching time. The control of the degree of etching can therefore be facilitated. The composition of the above-mentioned proportions is the most suitable.

With the liquid etchant having the specified composition and volumetric proportions as in the present embodiment, the part **4*b* of the porous alumina film and the part 3*b* of the aluminum layer which are not masked by the photoresist film 5 are etched and removed. In this case, the adhering force of the photoresist film 5** to the porous alumina film is strong, and the etching rate for the porous alumina film is 2 to 3 times as large as that for the aluminum layer as stated above. Therefore, the layer of aluminum and alumina is not vertically etched, but, as shown in FIG. 1*d*, the part **4*a* of the porous alumina film between the photoresist film 5 and the part 3*a* of the aluminum layer is side-etched, while the aluminum layer 3*a*** has a profile of gentle slope whose angle defined to the bottom of the layer itself is approximately 30°. Since the etching rate as a whole is comparatively small, control is extremely easy, and overetching is preventable.

Figure 1E:
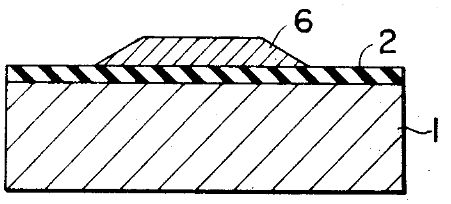

Subsequently, as shown in FIG 1*e*, the photoresist film 5 is removed by a photoresist material-removing liquid such as trichloroethylene, benzene and toluene, whereupon the porous alumina film **4*a* on the alumina layer 3*a*** is removed by a mixed solution consisting of phosphoric acid, chromic acid and water ($H_3PO_4$-$CrO_3$-$H_2O$) or a mixed solution consisting of phosphoric acid, acetic acid, nitric acid and water $$(H_3PO_4\text{-}CH_2COOH/HNO_3\text{-}H_2O).$$

Figure 2:
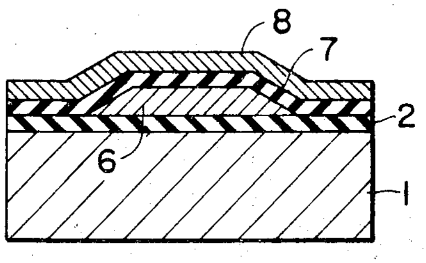
FIG. 2 is a longitudinal section of a multi-layer interconnection substrate to which the present invention has been applied.

An aluminium layer 6 whose corners are gently sloped and which constitutes the first layer of an interconnection portion is thus formed. In order to form multi-layer interconnections on the first layer composed of the interconnection portion 6 formed as stated above, as illustrated in FIG. 2, a material such as silicon oxide ($SiO_2$) and glass is deposited on the first layer of interconnection portion 6 to form an insulating film 7, an aluminum layer is formed thereon by evaporation, and the aluminum layer is partially etched to form the second layer of interconnection portion 8. Herein, since the first layer of the interconnection portion 6 has its sides formed gently, the insulating film 7 is formed on the interconnection portion 6 at a uniform thickness and gently. The second layer of interconnection portion 8 is also formed on the insulating film 7 with a gentle slope. The connection between the upper and lower layers of the interconnection portions is made through a through-hole etching portion at the position of their intersection. In the case of forming the second layer of interconnection portion 8 and the third and higher-order layers of interconnection portions, if the side-etching of the underlying interconnection portion relative to the photoresist film is utilized as in the formation of the first layer of interconnection portion 6, interconnections with corners of gentle slope will be produced. Thus, a multi-layer interconnection substrate can be formed which has three, four or more layers of interconnection portions and which is free from short-circuits and disconnections.

While, in the foregoing embodiment, the evaporated metal has been described as being aluminum such as an aluminum-silicon alloy of 2 to 3% by weight of silicon, or other metals, such as titanium, tantalum, zirconium, hafnium and molybdenum, are similarly applicable in addition to the simple aluminum substance, and bring about similar technical results. The etching rate for metals is decreased and that for metal oxides is increased by adding more $NH_4F$ to the etchant for the metals and metallic oxides, respectively.

We claim:

1. A method of forming a multi-layer interconnection substrate comprising the steps of:
- (a) preparing a substrate base;
- (b) forming a first metal layer on said base;
- (c) forming a porous metal oxide film on the surface of said first metal layer;
- (d) providing a masking layer on at least one selected area on the upper surface of said porous metal oxide film; and
- (e) etching said first metal layer and said metal oxide film thereon with an etching solution consisting of a mixture of phosphoric acid, acetic acid, water, ammonium fluoride and nitric acid, the volumetric ratio of which is 76:15:5:2 to 6:3.

2. A method according to claim 1, further comprising the steps of
- (f) removing said masking layer and said metal oxide film remaining after step (e);
- (g) forming an insulator layer on said first metal layer and said base; and
- (h) providing a second metal layer on said insulator layer.

3. A method according to claim 1, wherein said first metal layer is aluminum and said porous metal oxide film is a layer of aluminum oxide.

4. A method according to claim 3, wherein step (c) comprises the step of oxidizing said aluminum layer by anodic oxidation thereof.

5. A method according to claim 3, wherein step (c) comprises the step of oxidizing said aluminum layer by heating said layer in an oxygen atmosphere.

6. A method according to claim 1, wherein the temperature of said etching solution is from 20° C. to 60° C.

7. A method according to claim 4, wherein said step (d) comprises the step of forming a photoresist film on the porous aluminum oxide film.

8. A method according to claim 7, further comprising the steps of
- (f) removing said masking layer and said metal oxide film remaining after step (e);

(g) forming an insulator layer on said first metal layer and said base; and (h) providing a second metal layer on said insulator layer.

9. A method according to claim 2, further comprising the steps of forming additional insulator and metal layers on said second metal layer and carrying out steps (c)–(e) for said additional layers and said insulator layer and said second metal layer.

10. A method ccording to claim 1, wherein said first metal layer is an alloy of aluminum containing 2 to 3 percent by weight of silicon.

11. A method according to claim 1, wherein said substrate base comprises a base material and a surface protecting film provided thereon.

12. A method according to claim 6, wherein said etching solution temperature is about 40° C.

References Cited

UNITED STATES PATENTS

| | | | |
|---|---|---|---|
| 2,828,193 | 3/1958 | Newman | 252—79.3 |
| 3,290,570 | 12/1966 | Cunningham et al. | 117—217 X |
| 3,436,327 | 4/1969 | Shockley | 117—212 X |
| 3,443,311 | 5/1969 | Worobey | 117—217 X |
| 3,669,734 | 6/1972 | Jacob et al. | 117—217 |
| 3,699,011 | 10/1972 | Nishimura | 117—212 X |
| 3,700,508 | 10/1972 | Keen | 156—17 X |
| 3,720,143 | 3/1973 | Hashimoto et al. | 156—3 X |

WILLIAM A. POWELL, Primary Examiner

U.S. Cl. X.R.

117—217; 156—3, 11, 17; 252—79.3